(12) United States Patent
Liu

(10) Patent No.: US 8,169,265 B2
(45) Date of Patent: May 1, 2012

(54) PHASE LOCK LOOP CIRCUITS

(75) Inventor: Shiue-Shin Liu, HsinChu (TW)

(73) Assignee: Mediatek Inc., Hsin-Chu (TW)

( * ) Notice: Subject to any disclaimer, the term of this patent is extended or adjusted under 35 U.S.C. 154(b) by 103 days.

(21) Appl. No.: 12/431,842

(22) Filed: Apr. 29, 2009

(65) Prior Publication Data

US 2010/0277245 A1    Nov. 4, 2010

(51) Int. Cl.
 *H03L 7/00*    (2006.01)
(52) U.S. Cl. ............................................. 331/17; 331/34
(58) Field of Classification Search ..................... 331/17, 331/34, 186, 185
See application file for complete search history.

(56) References Cited

U.S. PATENT DOCUMENTS

| 7,250,823 B2 * | 7/2007 | Shields ............................ 331/16 |
| 2003/0222721 A1 * | 12/2003 | Schechinger et al. .......... 331/17 |
| 2006/0141963 A1 * | 6/2006 | Maxim et al. ............. 455/192.1 |

OTHER PUBLICATIONS

"A Dual-Supply 0.2-to-4GHz PLL Clock Multiplier in a 65nm Dual-Oxide CMOS Process" Session 17, Analog Techniques and PLLs, 17.4, 2007 IEEE International Solid-State Circuits Conference.

* cited by examiner

*Primary Examiner* — Joseph Chang
(74) *Attorney, Agent, or Firm* — Thomas|Kayden

(57) ABSTRACT

A phase lock loop circuit is provided. A phase frequency detector detects a phase difference between a feedback signal and a reference signal, and generates a phase error signal in response to the detected phase difference. A charge pump consists of at least one core device and outputs a current signal based on the phase error signal. An active loop filter receives and transfers the current signal into a control signal. Operating voltage of the active loop filter is higher than operating voltage of the charge pump. A controlled oscillator receives the control signal and generates an output signal in response to the control signal. A feedback divider receives the output signal to generate the feedback signal.

16 Claims, 7 Drawing Sheets

PHASE LOCK LOOP CIRCUITS

BACKGROUND OF THE INVENTION

1. Field of the Invention

The invention relates to a phase lock loop (PLL) circuit, and more particularly to an area efficient and low KVCO PLL circuit.

2. Description of the Related Art

PLL stands for Phase Lock Loop and is basically a closed loop frequency control system, wherein operation is based on the phase sensitive detection of phase differences between a feedback signal and a reference signal. A PLL circuit responds to both the frequency and the phase of input signals, automatically raising or lowering the frequency of a controlled oscillator until a feedback signal is matched to a reference signal in both frequency and phase. In simpler terms, a PLL compares the frequencies of two signals and produces a control signal which is proportional to the difference between the input frequencies. The control signal is used to drive a controlled oscillator, such as a voltage-controlled oscillator (VCO), which creates an output frequency. The output frequency is fed through a frequency divider back to the input of the system, producing a negative feedback loop. If the output frequency drifts, the control signal may increase, driving the frequency in the opposite direction so as to reduce the error. Thus, the output is locked to the frequency of the reference signal. This reference signal could be derived from a crystal oscillator, which is very stable in frequency.

PLL circuits are widely used in radio, telecommunications, computers and other electronic applications. They may generate stable frequencies, recover a signal from a noisy communications channel, or distribute clock timing pulses in digital logic designs such as microprocessors. The PLL with low gain value K of the controlled oscillator (i.e. the KVCO of the VCO) has several benefits. First of all, the jitter induced from control voltage Vctrl noise (e.g. reference spur, power noise couple) may be minimized. Second, loop filter capacitor size may be saved for a given bandwidth. Thus, both jitter performance and area would be beneficial from a low KVCO PLL design. However, low KVCO PLL may bring small frequency adjusting range if available Vctrl range is small, which is likely to happen in advanced technology. For example, in a pure 1.2V design, maximum available Vctrl range is only about 0.6V. To cover process variation and accommodate GHz-level output frequency, low KVCO may not be obtainable and KVCO is inevitably approaching several GHz % Volt range. Therefore, an area efficient and low KVCO PLL circuit solving the above-mentioned problems is highly desired.

BRIEF SUMMARY OF THE INVENTION

PLL circuits are provided. An embodiment of such a PLL circuit comprises a phase frequency detector, a charge pump, an active loop filter, a controlled oscillator, and a feedback divider. The phase frequency detector detects a phase difference between a feedback signal and a reference signal, and generates a phase error signal in response to the detected phase difference. The charge pump consists of at least one core device and outputs a current signal based on the phase error signal. Core devices may have lower operating voltage, thinner oxide and higher operating speed than I/O devices. The active loop filter receives and transfers the current signal into a control signal. Operating voltage of the active loop filter is higher than operating voltage of the charge pump. The controlled oscillator receives the control signal and generates an output signal in response to the control signal. The feedback divider receives the output signal to generate the feedback signal.

Another embodiment of a PLL circuit comprises a phase frequency detector, a charge pump, an active loop filter, a controlled oscillator, and a feedback divider. The phase frequency detector detects a phase difference between a feedback signal and a reference signal, and generates a phase error signal in response to the detected phase difference. The charge pump consists of at least one core device and outputs a first current signal and a second current signal based on the phase error signal. The second current signal is a multiple of the first current signal. The active loop filter receives and transfers the first current signal and the second current signal into a first control signal and a second control signal. Operating voltage of the active loop filter is higher than operating voltage of the charge pump. The controlled oscillator receives and combines the first and second control signals to generate a combined control signal, and generates an output signal in response to the combined control signal. The feedback divider receives the output signal to generate the feedback signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
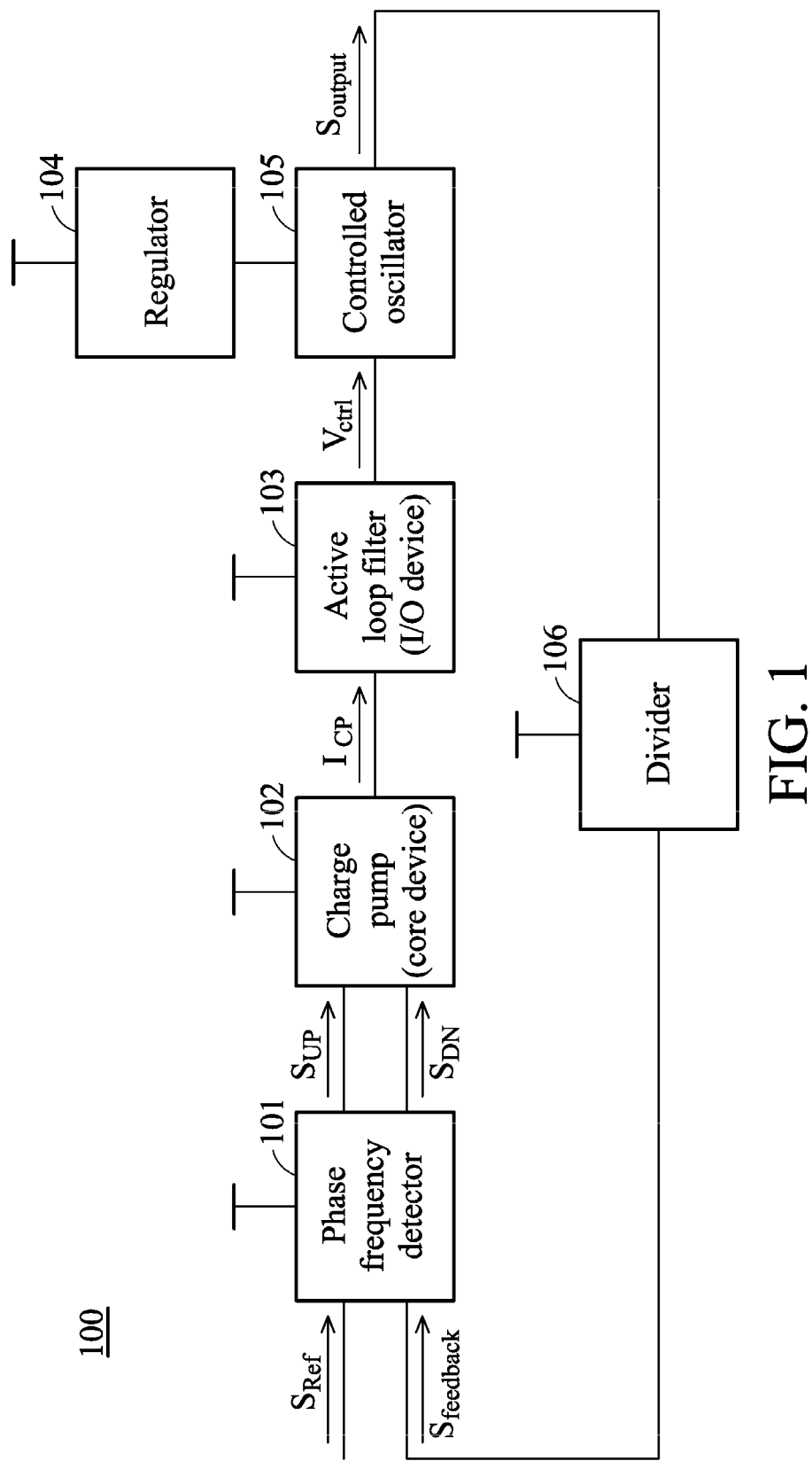
FIG. 1 shows a phase lock loop circuit according to an embodiment of the invention.

FIG. 1 shows a phase lock loop (PLL) circuit according to an embodiment of the invention. As shown in FIG. 1, the phase lock loop 100 comprises a phase frequency detector 101, a charge pump 102, an active loop filter 103, a regulator 104, a controlled oscillator 105 and a feedback divider 106. The phase frequency detector 101 detects a phase difference between a feedback signal $S_{feedback}$ and a reference signal $S_{Ref}$, and generates phase error signals $S_{UP}$ and $S_{DN}$ in response to the detected phase difference. The charge pump 102 outputs a current signal $I_{CP}$ based on the phase error signals $S_{UP}$ and $S_{DN}$. The active loop filter 103 receives and transfers the current signal $I_{CP}$ into a control signal $V_{ctrl}$. The controlled oscillator 105 receives the control signal $V_{ctrl}$ and generates an output signal $S_{output}$ in response to the control signal $V_{ctrl}$. According to an embodiment of the invention, the controlled oscillator 105 may be a Voltage Controlled Oscillator (VCO) to generate the output signal $S_{output}$ in response to the control signal $V_{ctrl}$. The frequency of the output signal $S_{output}$ may or may not be proportional to the voltage level or the current level of the control signal $V_{ctrl}$. The power supplied to the controlled oscillator 105 is regulated by using the regulator 104 to reduce the impact of power supply noise. The feedback divider 106 receives the output signal $S_{output}$ to generate the feedback signal $S_{feedback}$. The frequency of the output signal $S_{output}$ may or may not be a multiple of a frequency of the feedback signal $S_{feedback}$. As an example, the frequency of the output signal $S_{output}$ may be N times of the frequency of the feedback signal $S_{feedback}$, and the feedback divider 106 may be implemented by counters to divide the frequency of the output signal $S_{output}$ by N. The feedback signal $S_{feedback}$ is fed back to the input of the phase frequency detector 101 and the phase difference between the feedback signal $S_{feedback}$ and the reference signal $S_{Ref}$ is again detected, so as to correct the frequency of the output signal $S_{output}$ until the frequency of the feedback signal $S_{feedback}$ is locked to the frequency of the reference signal $S_{Ref}$, wherein the reference signal $S_{Ref}$ may be derived by an oscillator very stable in frequency.

According to the embodiment of the invention, the phase frequency detector 101, the charge pump 102 and the feedback divider 106 may consist of core devices implemented in an advanced process so as to operate at a lower operating voltage and a higher speed; as an example, a 65 nm CMOS process with operating voltage of 1.2V. On the other hand, in order to enlarge the available voltage range of the control signal $V_{ctrl}$ for providing wider frequency adjusting range (or so-called lock range) of the PLL 100, the active loop filter may consist of at least one I/O device operating at a higher operating voltage. As an example, the operating voltage of the active loop filter may be 3.3V so that the maximum available voltage of the control signal $V_{ctrl}$ may achieve 3.3V, which is higher than the 1.2V operating voltage of the core devices. Once the available voltage range of the control signal $V_{ctrl}$ is enlarged, the gain value K of the controlled oscillator may be reduced. It is known in the art that the PLL with low KVCO has several benefits. As an example, the jitter induced from the control signal $V_{ctrl}$ noise (e.g. reference spur, power noise couple) may be reduced so as to achieve a more stable PLL system. Thus, an enlarged available voltage range of the control signal $V_{ctrl}$ that accompanies a low controlled oscillator gain value K may achieve wider frequency adjusting range and, at the same time, further avoid the disadvantages caused by a high controlled oscillator gain value K, should it be used.

Figure 2:
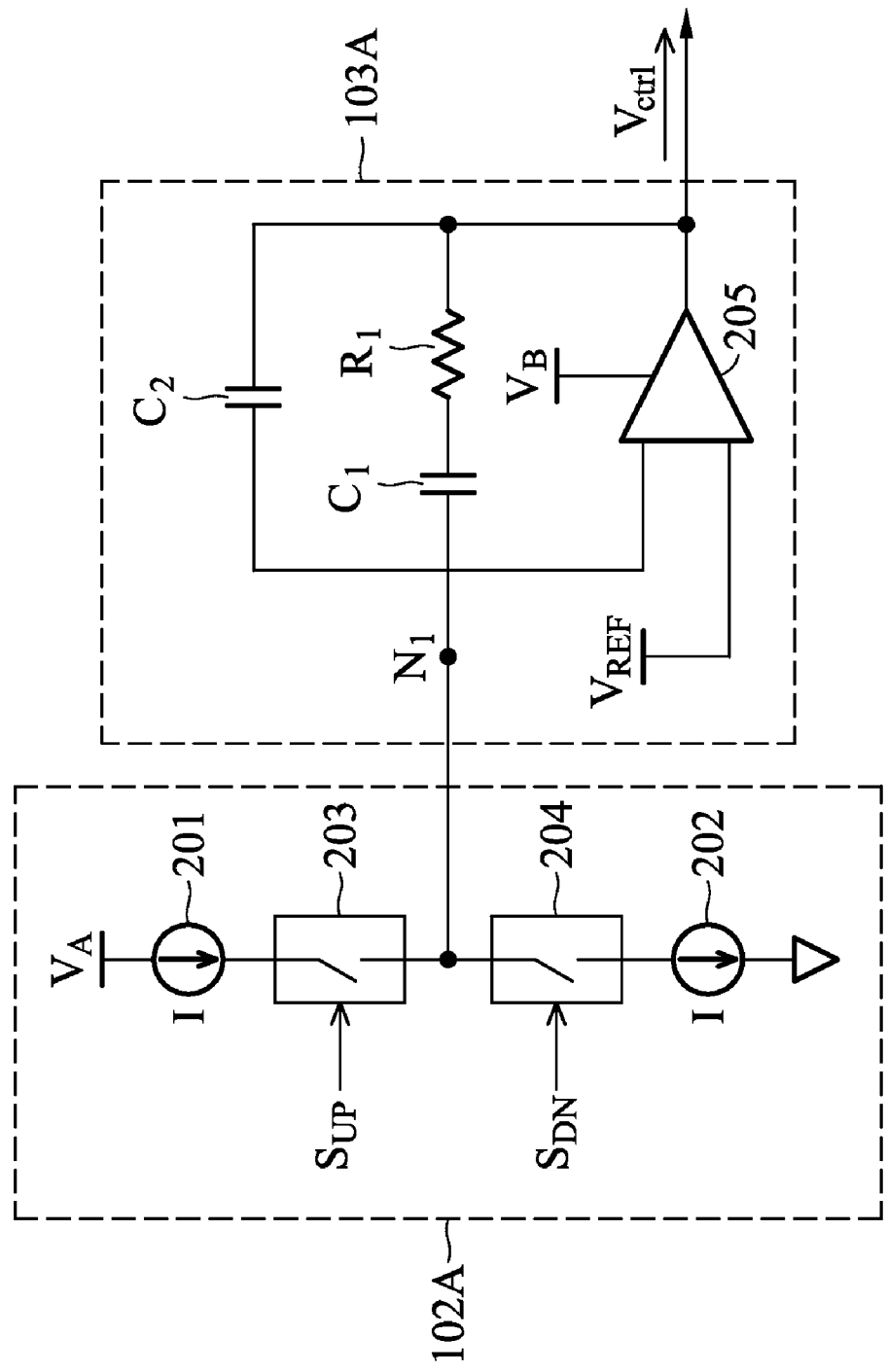
FIG. 2 shows the circuits of the charge pump and the active loop filter according to an embodiment of the invention.

FIG. 2 shows the circuits of the charge pump and the active loop filter according to an embodiment of the invention. As shown in FIG. 2, the charge pump 102A comprises two current sources 201 and 202 providing current I, and two switches 203 and 204. The switch 203 is controlled by the phase error signal $S_{UP}$ and switch 204 is controlled by the phase error signal $S_{DN}$. The phase frequency detector 101 outputs the phase error signal Sup so as to turn on the switch 203 for charging the capacitors in the active loop filter 103A when the frequency of the feedback signal $S_{feedback}$ falls behind the frequency of the reference signal $S_{Ref}$, and outputs the phase error signal $S_{DN}$ so as to turn on the switch 204 for discharging the capacitors when the frequency of the feedback signal $S_{feedback}$ exceeds the frequency of the reference signal $S_{Ref}$. The active loop filter 103A comprises an amplifier 205, a resistor $R_1$, and capacitors $C_1$ and $C_2$. The amplifier 205 may be an operational amplifier and comprise a first input terminal coupled to the charge pump 102A, a second input terminal coupled to a reference voltage $V_{REF}$, and an output terminal outputting the control signal $V_{ctrl}$. The capacitor $C_1$ is coupled with the resistor $R_1$ in serial between the first input terminal and the output terminal of the amplifier 205. The capacitor $C_2$ is coupled between the first input terminal and the output terminal of the amplifier 205.

As previously discussed, the electric elements adopted in the charge pump 102A may be core devices implemented in an advanced process so as to operate at a low operating voltage $V_A$ and a high speed. On the other hand, the amplifier 205 may be an I/O device supplied by a voltage $V_B$ higher than the operating voltage $V_A$ of the charge pump 102A. The loop filter with resistor $R_1$ and capacitors $C_1$ and $C_2$ forms a negative feedback loop of the amplifier 205, so as to make the charge pump 102A always see the virtual ground node $N_1$, which substantially approaches the reference voltage $V_{REF}$. Via the charge and discharge operations of the charge pump 102A, the maximum available voltage of the output control signal $V_{ctrl}$ is no longer limited by the operating voltage $V_A$ of the charge pump 102A, and may achieve a value higher than the operating voltage $V_A$. As an example, when the electric elements adopted in the charge pump 102A are implemented in a 65 nm CMOS process with operating voltage of 1.2V ($V_A$) and the amplifier 205 may consist of at least one I/O device with operating voltage of 3.3V ($V_B$), the maximum available voltage of the output control signal $V_{ctrl}$ may theoretically achieve 3.3V, which is much higher than operating voltage $V_A$ of the charge pump 102A.

Figure 3:
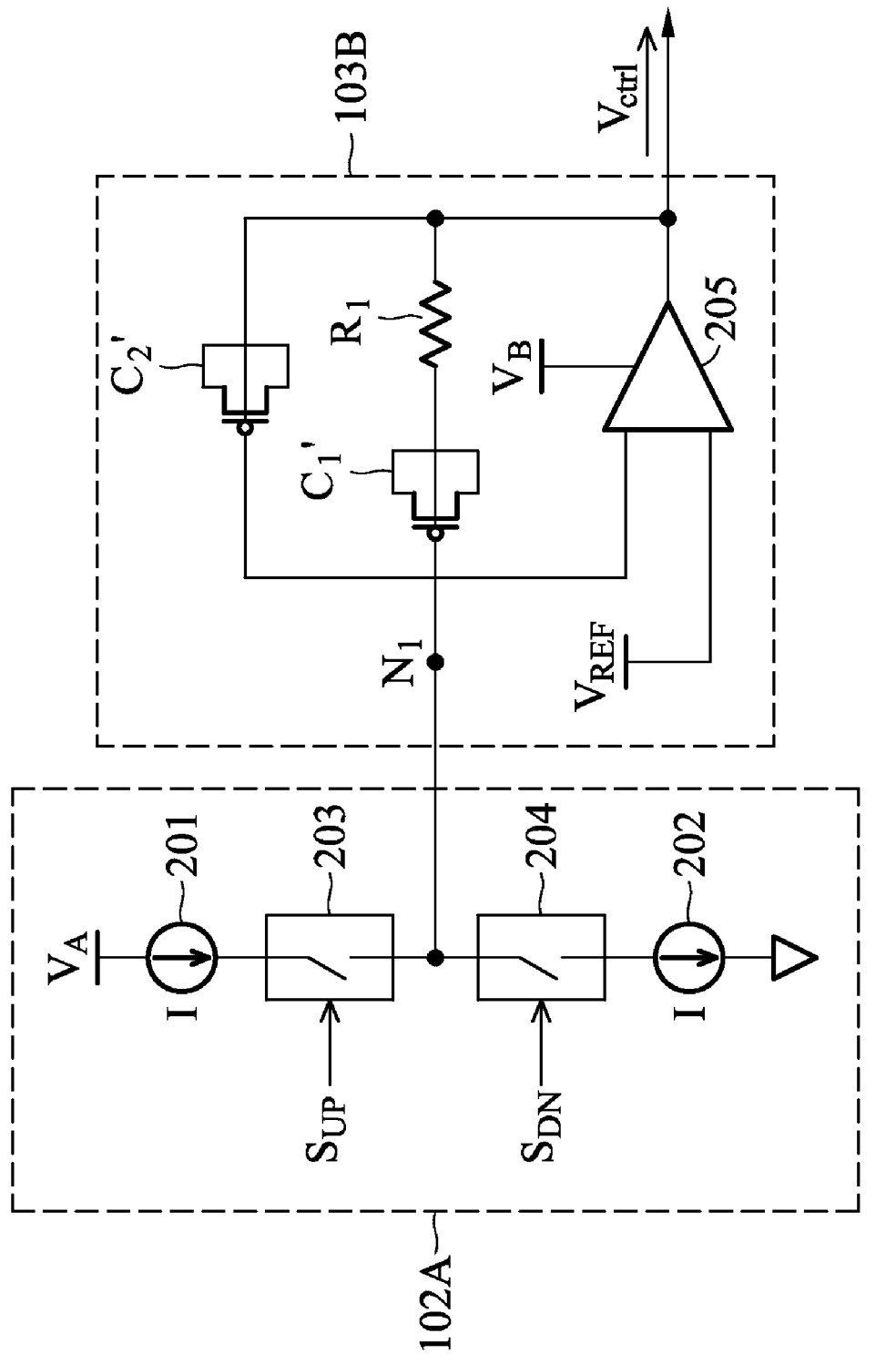
FIG. 3 shows the circuits of the charge pump and the active loop filter according to another embodiment of the invention.

With the enlarged maximum available voltage of the output control signal $V_{ctrl}$, the gain value K of the controlled oscillator 105 may be reduced and thus, the loop filter capacitor size may also be reduced for a given bandwidth. According to the embodiment of the invention, the capacitors $C_1$ and $C_2$ may be Metal Insulator Metal (MIM) capacitors, Metal Oxide Metal (MOM) capacitors or any combinations thereof. As shown in FIG. 3, according to another embodiment of the invention, the capacitors may also be adopted as MOS capacitors $C_1'$ and $C_2'$ to further save required area.

Figure 4:
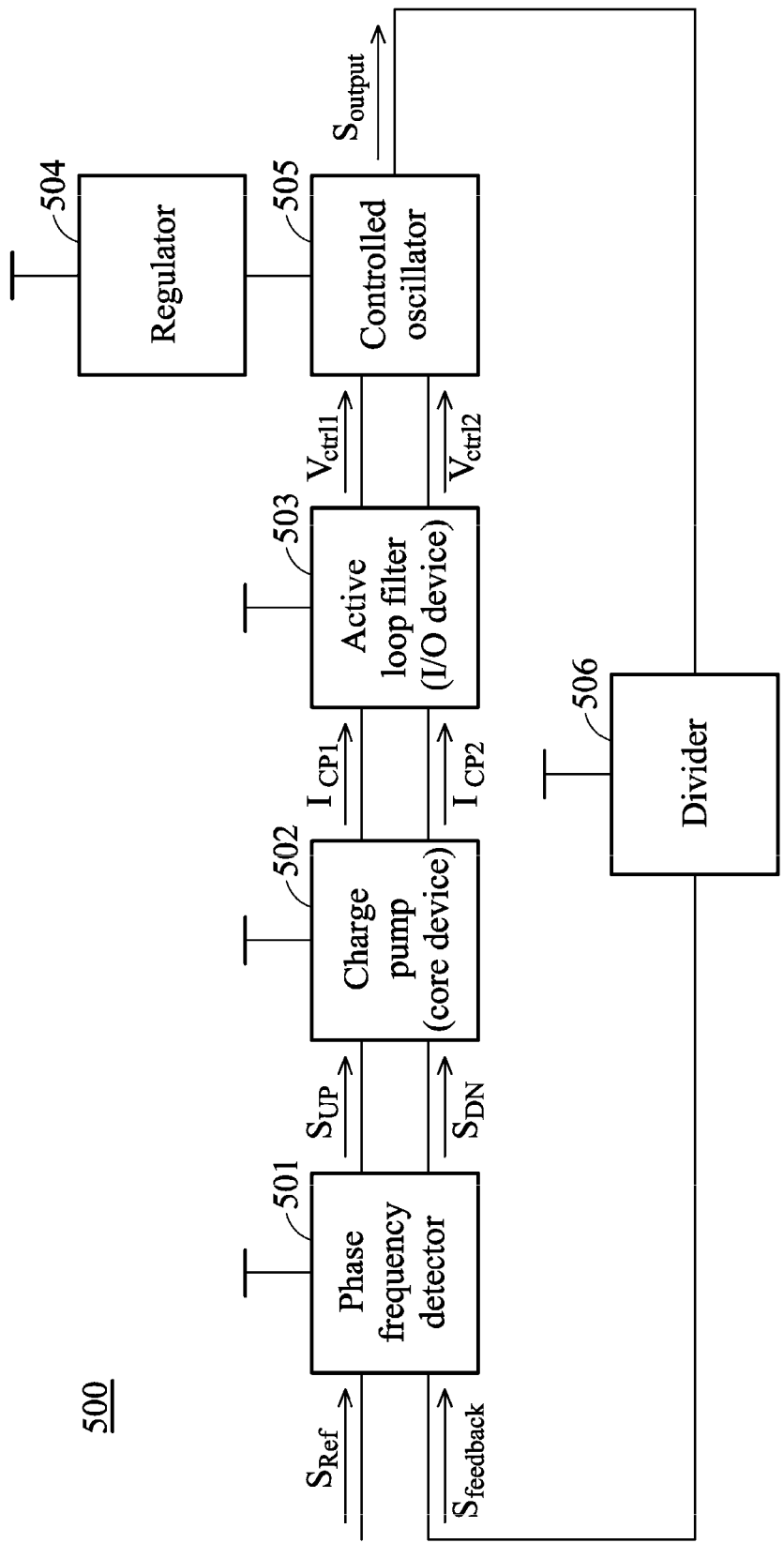
FIG. 4 shows a phase lock loop circuit according to another embodiment of the invention.

FIG. 4 shows a phase lock loop circuit according to another embodiment of the invention. As shown in FIG. 4, the phase lock loop 500 comprises a phase frequency detector 501, a charge pump 502, an active loop filter 503, a regulator 504, a controlled oscillator 505 and a feedback divider 506. The operations of the phase frequency detector 501, the regulator 504 and the feedback divider 506 are similar with that of the phase frequency detector 101, the regulator 104 and the feedback divider 106, and are not illustrated here for brevity. In this embodiment, the charge pump 502 outputs current signals $I_{CP1}$ and $I_{CP2}$ based on the phase error signals. The active loop filter 503 receives the current signals $I_{CP1}$ and $I_{CP2}$ and transfers the current signals $I_{CP1}$ and $I_{CP2}$ respectively into control signals $V_{ctrl1}$ and $V_{ctrl2}$. The controlled oscillator 505 receives and combines the control signals $V_{ctrl1}$ and $V_{ctrl2}$ to generate a combined control signal $V_{ctrl}$, and generates an output signal $S_{output}$ in response to the combined control signal $V_{ctrl}$. A frequency of the output signal $S_{output}$ may or may not be proportional to the voltage level or the current level of the combined control signal $V_{ctrl}$. According to the embodiment of the invention, the phase frequency detector 501, the charge pump 502 and the feedback divider 506 may consist of core devices implemented in an advanced process so as to operate at a lower operating voltage and a higher speed; as an example, a 65 nm CMOS process with operating voltage of 1.2V. On the other hand, as the similar concept previously discussed, in order to enlarge the available voltage range of the combined control signal $V_{ctrl}$ for providing a wider frequency adjusting range (or so-called lock range) of the PLL 500, the active loop filter 503 may consist of at least one I/O device operating at a higher operating voltage. As an example, the operating voltage of the active loop filter 503 may be 3.3V so that the maximum available voltage of the combined control signal $V_{ctrl}$ may achieve 3.3V, which is higher than the 1.2V operating voltage of the core devices.

Figure 5:
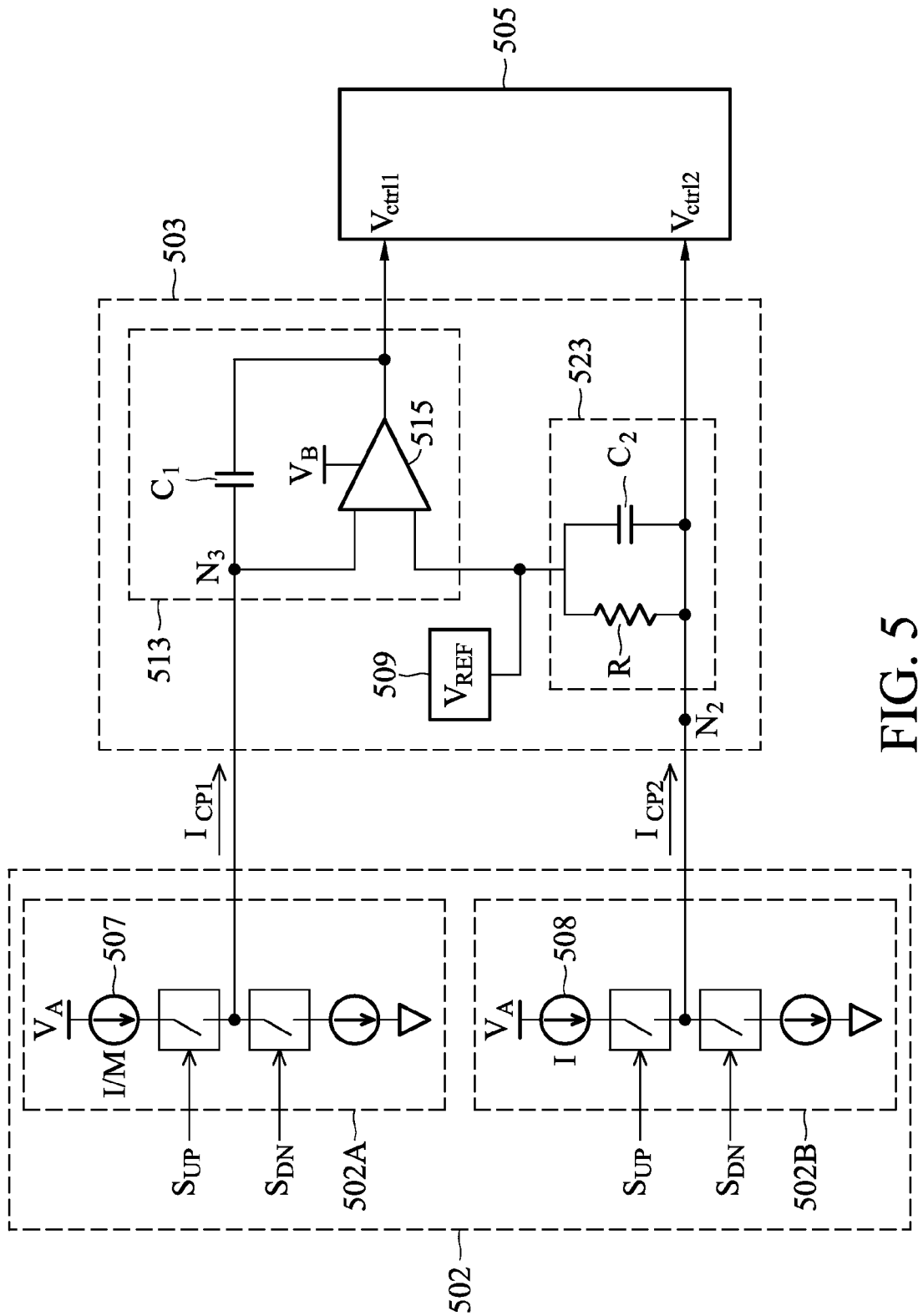
FIG. 5 shows the circuits of the charge pump and the active loop filter according to another embodiment of the invention.

FIG. 5 shows the circuits of the charge pump and the active loop filter according to another embodiment of the invention. As shown in FIG. 5, the charge pump 502 comprises two charge pump units 502A and 502B, each being an individual charge pump and comprising two current sources and two switches. The charge pump unit 502A outputs the current signal $I_{CP1}$ based on the phase error signals $S_{UP}$ and $S_{DN}$. Similarly, the charge pump unit 502B outputs the current signal $I_{CP2}$ based on the phase error signals $S_{UP}$ and $S_{DN}$. The operations of the charge pump units 502A and 502B are similar with that of the charge pump 102A and are not illustrated here for brevity. The current signals $I_{CP1}$ and $I_{CP2}$ are output simultaneously so as to charge or discharge the active loop filter 503 according to the phase error signals $S_{UP}$ and $S_{DN}$ logics. The active loop filter 503 comprises two filtering paths 513 and 523 respectively coupled to the charge pump units 502A and 502B. The first filtering path 513 comprises an amplifier 515 and a capacitor $C_1$. The amplifier 515 may be an operational amplifier and comprise a first input terminal coupled to one terminal of the capacitor $C_1$ and the charge pump unit 502A to receive the current signal $I_{CP1}$, a second input terminal coupled to a reference voltage generator 509 generating a reference voltage $V_{REF}$, and an output terminal coupled to another terminal of the capacitor $C_1$ and outputting the control signal $V_{ctrl1}$ to the controlled oscillator 505. The second filtering path 523 comprises a resistor R and a capacitor $C_2$. The filtering output terminal $N_2$ of the second filtering path receives the current signal $I_{CP2}$ and outputs the control signal $V_{ctrl2}$. The capacitor $C_2$ is coupled in parallel with the resistor R between the reference voltage generator 509 and the filtering output terminal $N_2$. It is to be noted that the current source 508 generates a current as a multiple of the current generated by the current source 507. Thus, the current signal $I_{CP2}$ is a multiple of the current signal $I_{CP1}$. As shown in FIG. 5, as an example, the current source 508 generates a current I that is M times the current I/M generated by the current source 507.

Summing $V_{ctrl1}$ and $V_{ctrl2}$ Yields Overall Transfer Function $$V_{ctrl1} + V_{ctrl2} = \frac{I_{CP1}}{sC_1} + \frac{I_{CP2}R}{1+sRC_2} \qquad \text{Eq. 1}$$
$$= \frac{I/M}{sC_1} + \frac{IR}{1+sRC_2}$$
$$= \frac{I}{sMC_1} \cdot \frac{1+sR(MC_1+C_2)}{(1+sRC_2)}$$
$$= \frac{I}{sC_1^N} \cdot \frac{1+sR(C_1^N+C_2)}{(1+sRC_2)}$$

where $C_1^N = M*C_1$. The M times relationship of the current sources 507 and 508 results in the equivalent capacitance of the capacitor $C_1$ being further amplified M times. Thus, when compared to the active loop filter 103A shown in FIG. 2, the area required by the capacitor $C_1$ of active loop filter 503 is further reduced M times.

The control signals $V_{ctrl1}$ and $V_{ctrl2}$ are further combined by the controlled oscillator 505 to generate the combined control signal $V_{ctrl}$. As previously discussed, the electric elements adopted in the charge pump units 502A and 502B may be core devices implemented in an advanced process so as to operate at a lower operating voltage $V_A$ and a higher speed. On the other hand, the amplifier 515 may consist of at least one I/O device supplied by a voltage $V_B$ higher than the operating voltage $V_A$ of the charge pump units 502A and 502B. The capacitor $C_1$ forms a negative feedback loop of the amplifier 515 so as to make the charge pump unit 502A substantially always see the virtual ground node $N_3$, which substantially approaches the reference voltage $V_{REF}$. Via the charge and discharge operations of the charge pump units 502A, the maximum available voltage of the control signal $V_{ctrl1}$ is no longer limited by the operating voltage $V_A$ of the charge pump units 502A, and may achieve a value higher than the operating voltage $V_A$. As an example, when the electric elements adopted in the charge pump units 502A and 502B are implemented in a 65 nm CMOS process with operating voltage of 1.2V ($V_A$) and the amplifier 515 consist of at least one I/O device with operating voltage of 3.3V ($V_B$), the maximum available voltage of control signal $V_{ctrl1}$ may achieve 3.3V, which is much higher than operating voltage $V_A$ of the charge pump units 502A and 502B. In addition, with the enlarged maximum available voltage of the combined control signal $V_{ctrl}$, the gain value K of the controlled oscillator 505 may be reduced and thus, the loop filter capacitor size may also be reduced for a given bandwidth. In addition, by using the capacitor multiplication technology, the area required by the capacitor $C_1$ of the active loop filter 503 is further reduced by M times for achieving the same loop filter bandwidth as compared to the structure of the active loop filter 103A. According to the embodiment of the invention, the capacitors $C_1$ and $C_2$ may be Metal Insulator Metal (MIM) capacitors, Metal Oxide Metal (MOM) capacitors or any combinations thereof.

Figure 7:
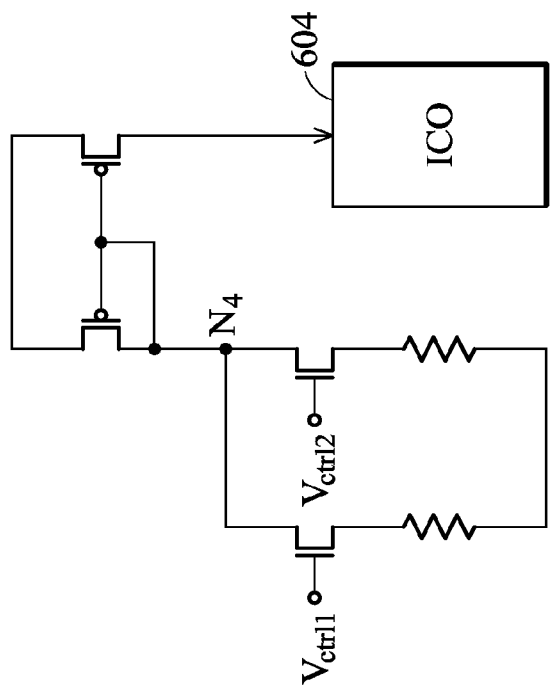
FIG. 7 shows a detailed circuit of a controlled oscillator combining the control signals according to an embodiment of the invention.
Figure 6:
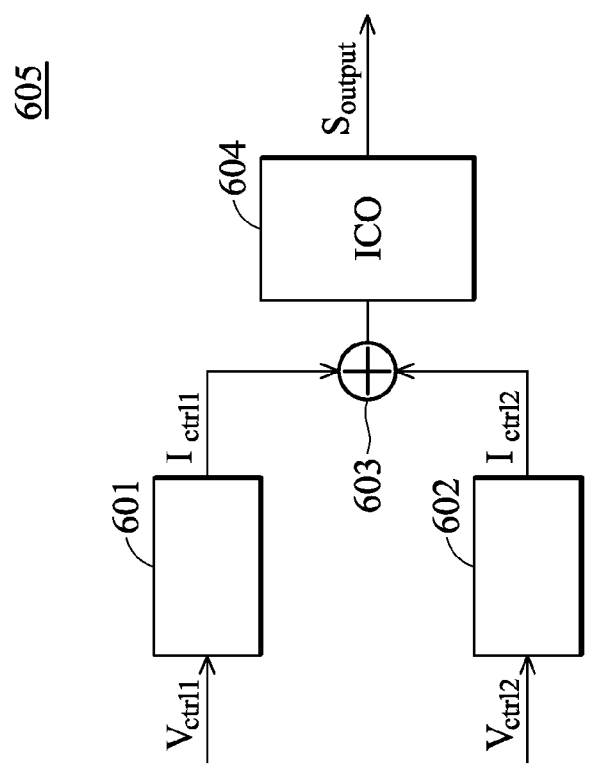
FIG. 6 shows an exemplary circuit of a controlled oscillator combining the control signals according to an embodiment of the invention.

FIG. 6 shows an exemplary circuit of a controlled oscillator 605 combining the control signals $V_{ctrl1}$ and $V_{ctrl2}$ according to an embodiment of the invention. As shown in FIG. 6, the control signals $V_{ctrl1}$ and $V_{ctrl2}$ may be respectively converted to current control signals $I_{ctrl1}$ and $I_{ctrl2}$ by the voltage to current converters 601 and 602. The current control signals $I_{ctrl1}$ and $I_{ctrl2}$ may further be combined by a summer 603 in current domain before fed into current control oscillator (ICO) 604. The current control oscillator 604 receives the combined current control signal and generates the output signal $S_{output}$ in response to the combined current control signal. The frequency of the output signal $S_{output}$ may or may not be proportional to the amount of current of the combined current control signal. FIG. 7 shows a detailed circuit of the controlled oscillator combining the control signals $V_{ctrl1}$ and $V_{ctrl2}$ according to an embodiment of the invention. As can be seen, the corresponding currents of the control signals $V_{ctrl1}$ and $V_{ctrl2}$ are summed at node $N_4$, and fed into the current control oscillator (ICO) 604 via a current mirror.

Figure 8:
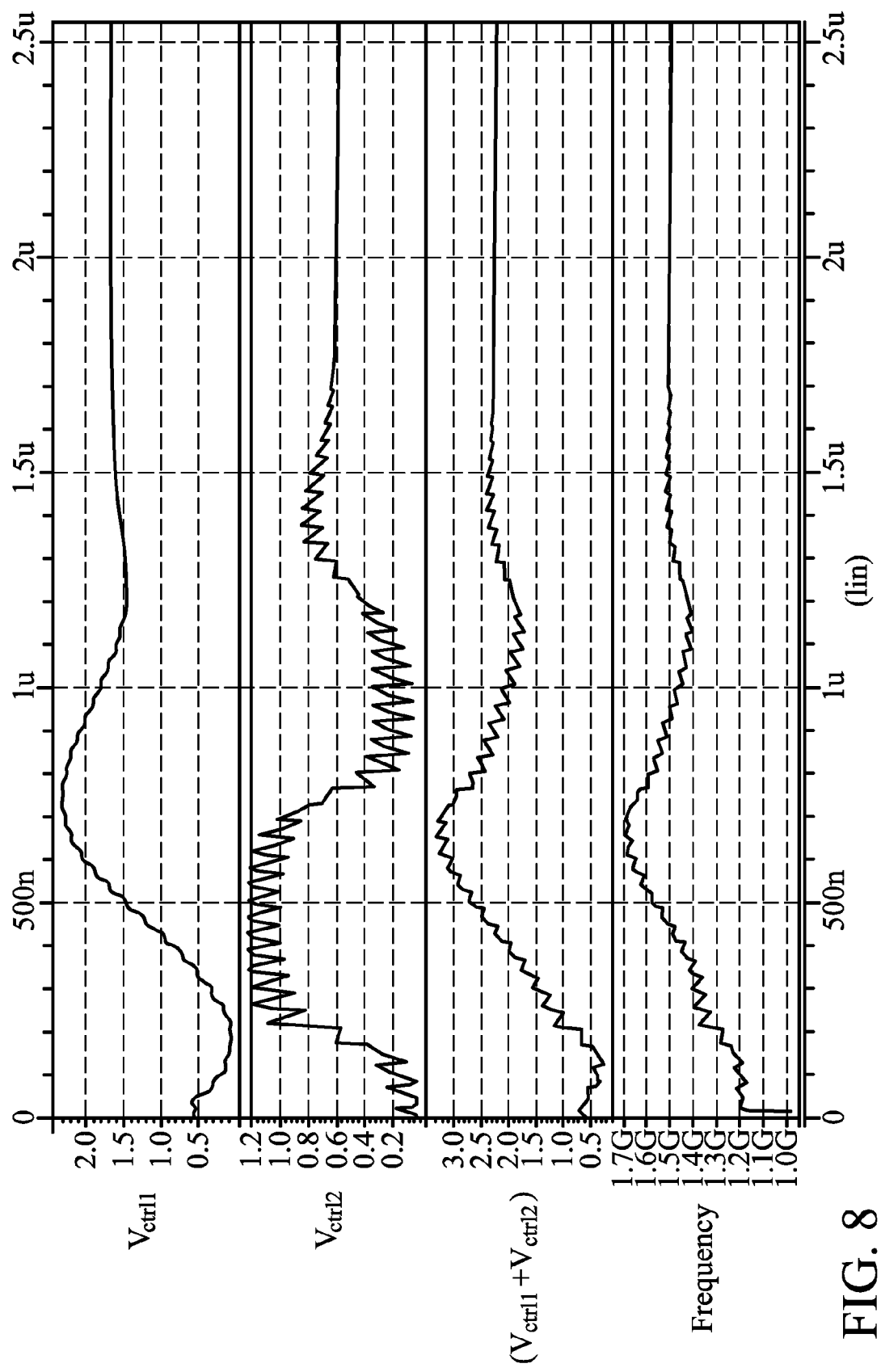
FIG. 8 shows simulation waveforms of the control signals and frequency of the output signal according to the embodiment of the invention.

FIG. 8 shows simulation waveforms of the control signals and frequency of the output signal according to the embodiment of the invention. As shown in FIG. 8, the first row is a voltage waveform of the control signal $V_{ctrl1}$ output from the first filtering path 513, the second row is a voltage waveform of the control signal $V_{ctrl2}$ output from the second filtering path 523, the third row is a voltage waveform of the combined control signal $V_{ctrl}$, where ($V_{ctrl} = V_{ctrl1} + V_{ctrl2}$) and the fourth row is the corresponding frequency of the output signal $S_{output}$, which may or may not be proportional to the voltage of the combined control signal. It can be seen that the control signal $V_{ctrl1}$ is about 0.5V at the beginning, and is finally locked at about 1.7V. Because the active loop filter technique is adopted, the maximum available voltage on the first filtering path may reach about 3.3V. The control signal $V_{ctrl2}$ is oscillated between 1.2V and 0V, which is the output range of a lower operating voltage charge pump. After the output frequency of the controlled oscillator is locked, the control signal $V_{ctrl2}$ is locked at about $V_{REF}$. It can be seen that the output frequency ($4^{th}$ row) mimics the voltage of the combined control signal $V_{ctrl}$, and finally, the output frequency is locked at about 1.5 GHz.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A phase lock loop circuit, comprising:
a phase frequency detector detecting a phase difference between a feedback signal and a reference signal, and generating a phase error signal in response to the detected phase difference;
a charge pump outputting a current signal based on the phase error signal, wherein the charge pump consists of at least one core device;
an active loop filter receiving and transferring the current signal into a control signal, consisting of at least one I/O device, wherein an operating voltage of the core device is lower than an operating voltage of the I/O device, that let an operating voltage of the active loop filter is higher than an operating voltage of the charge pump;
a controlled oscillator receiving the control signal and generating an output signal in response to the control signal; and
a feedback divider receiving the output signal to generate the feedback signal.

2. The phase lock loop circuit as claimed in claim 1, wherein a maximum available voltage of the control signal is higher than the operating voltage of the charge pump.

3. The phase lock loop circuit as claimed in claim 1, wherein the active loop filter comprises an amplifier outputting the control signal.

4. The phase lock loop circuit as claimed in claim 1, wherein the active loop filter comprises:
an amplifier comprising a first input terminal coupled to the charge pump, a second input terminal coupled to a reference voltage, and an output terminal outputting the control signal;
a resistor;
a first capacitor coupled with the resistor in serial between the first input terminal and the output terminal; and
a second capacitor coupled between the first input terminal and the output terminal.

5. The phase lock loop circuit as claimed in claim 4, wherein the first capacitor and the second capacitor are Metal Insulator Metal (MIM) capacitors, Metal Oxide Metal (MOM) capacitors, Metal Oxide Semiconductor (MOS) capacitors or any combinations thereof.

6. The phase lock loop circuit as claimed in claim 1, wherein the phase frequency detector and the feedback divider consist of core devices.

7. A phase lock loop circuit, comprising:
a phase frequency detector detecting a phase difference between a feedback signal and a reference signal, and generating a phase error signal in response to the detected phase difference;
a charge pump outputting a first current signal and a second current signal based on the phase error signal, wherein the charge pump consists of at least one core device and wherein the second current signal is a multiple of the first current signal;
an active loop filter receiving and transferring the first current signal and the second current signal into a first control signal and a second control signal, consisting of at least one I/O device, wherein an operating voltage of the core device is lower than an operating voltage of the I/O device, that let an operating voltage of the active loop filter is higher than an operating voltage of the charge pump;
a controlled oscillator receiving and combining the first and second control signals to generate a combined control signal, and generating an output signal in response to the combined control signal; and
a feedback divider receiving the output signal to generate the feedback signal.

8. The phase lock loop circuit as claimed in claim 7, wherein a maximum available voltage of the combined control signal is higher than the operating voltage of the charge pump.

9. The phase lock loop circuit as claimed in claim 7, wherein the phase frequency detector and the feedback divider consist of core devices and the active loop filter consists of at least one I/O device.

10. The phase lock loop circuit as claimed in claim 7, wherein the charge pump comprises a first charge pump unit outputting the first current signal based on the phase error signal and a second charge pump unit outputting the second current signal based on the phase error signal, and wherein the first current signal and the second current signal are output simultaneously.

11. The phase lock loop circuit as claimed in claim 7, wherein the active loop filter comprises:
a first filtering path receiving the first current signal and generating the first control signal, wherein the first filtering path comprises an amplifier operating at a predetermined operating voltage higher than the operating voltage of the charge pump; and
a second filtering path receiving the second current signal and generating the second control signal.

12. The phase lock loop circuit as claimed in claim 11, wherein the amplifier directly outputs the first control signal to the controlled oscillator.

13. The phase lock loop circuit as claimed in claim 11, wherein the first filtering path further comprises a first capacitor, and wherein the amplifier comprises a first input terminal coupled to one terminal of the first capacitor and receiving the first current signal, a second input terminal coupled to a reference voltage, and an output terminal coupled to another terminal of the first capacitor and outputting the first control signal.

14. The phase lock loop circuit as claimed in claim 13, wherein the second filtering path comprises:
a filtering output terminal receiving the second current signal and outputting the second control signal;
a resistor; and
a second capacitor coupled in parallel with the resistor between a reference voltage and the filtering output terminal.

15. The phase lock loop circuit as claimed in claim 14, wherein the first capacitor and the second capacitor are Metal Insulator Metal (MIM) capacitors, Metal Oxide Metal (MOM) capacitors or any combinations thereof.

16. The phase lock loop circuit as claimed in claim 7, wherein the controlled oscillator comprises a first voltage to current converter, a second voltage to current converter, a current mirror unit and a current controlled oscillator, and wherein the first voltage to current converter and the second voltage to current converter respectively converts the first and second control signals to a first current control signal and a second current control signal, the current mirror unit combines the first and second current control signals to obtain the combined control signal and feeds the combined control signal into the current controlled oscillator, and the current controlled oscillator generates the output signal in response to the combined control signal.

* * * * *